(12) United States Patent
Parizeau et al.

(10) Patent No.: US 8,943,757 B2
(45) Date of Patent: Feb. 3, 2015

(54) PREFABRICATED VERTICAL DATA CENTER MODULES AND METHOD OF LARGE-SCALE DEPLOYMENT

(71) Applicant: Vert.com, Inc., Montreal (CA)

(72) Inventors: Marc Parizeau, Quebec (CA); Éric Mateu-Huon, Montreal (CA); Philippe Savard, Repentigny (CA)

(73) Assignee: Vert.com Inc., Montreal (CA)

( * ) Notice: Subject to any disclaimer, the term of this patent is extended or adjusted under 35 U.S.C. 154(b) by 0 days.

(21) Appl. No.: 13/746,042

(22) Filed: Jan. 21, 2013

(65) Prior Publication Data

US 2014/0157692 A1    Jun. 12, 2014

Related U.S. Application Data

(60) Provisional application No. 61/736,270, filed on Dec. 12, 2012.

(51) Int. Cl.
    *E04H 1/00* (2006.01)
(52) U.S. Cl.
    CPC ..................................... *E04H 1/005* (2013.01)
    USPC ............ 52/79.1; 52/173.1; 361/694; 361/696
(58) Field of Classification Search
    USPC .......................... 52/79.1, 173.1; 361/694, 696
    See application file for complete search history.

(56) References Cited

U.S. PATENT DOCUMENTS

| | | | |
|---|---|---|---|
| 6,374,627 B1 * | 4/2002 | Schumacher et al. ....... | 62/259.2 |
| 6,832,490 B2 | 12/2004 | Bash | |
| 7,020,586 B2 | 3/2006 | Snevely | |
| 7,278,273 B1 | 10/2007 | Whitted | |
| 7,551,971 B2 | 6/2009 | Hillis | |
| 7,672,128 B2 | 3/2010 | Noteboom | |
| 7,724,513 B2 | 5/2010 | Coglitore | |
| 7,738,251 B2 * | 6/2010 | Clidaras et al. ............... | 361/701 |
| 7,971,446 B2 | 7/2011 | Clidaras | |
| 8,360,834 B1 * | 1/2013 | Semmes ........................ | 454/242 |
| 8,462,496 B2 * | 6/2013 | Schmitt et al. ........... | 361/679.47 |
| 8,514,572 B2 * | 8/2013 | Rogers ........................... | 361/695 |
| 2008/0055850 A1 * | 3/2008 | Carlson et al. ................ | 361/695 |
| 2008/0185446 A1 * | 8/2008 | Tozer ........................... | 236/49.4 |
| 2008/0209931 A1 * | 9/2008 | Stevens ........................ | 62/259.2 |
| 2009/0229194 A1 | 9/2009 | Armillas | |

(Continued)

*Primary Examiner* — Brian Glessner
*Assistant Examiner* — Joshua Ihezie
(74) *Attorney, Agent, or Firm* — Brouillette & Partners; Robert Brouillette

(57) ABSTRACT

A data center module is a data center that can be prefabricated using generally standardized off-the-shelf components, and quickly assembled on a collocation site where a shared central facility is provided. The data center module is typically configured to be deployed with other identical data center modules around the central facility both in side-to-side and/or in back-to-back juxtapositions, typically without the need for interleaving space between adjacent modules in order to maximize real estate use. Each data center module typically comprises harden party walls, several floors for accommodating all the necessary electrical and cooling subsystems and for accommodating all the computing machinery (e.g. servers). Though all the data center modules share similar physical configuration, each data center module can be independently customized and operated to accommodate different needs. Each data center module also incorporates a highly efficient hybrid cooling system that can benefit from both air-side and water-side economizers.

9 Claims, 10 Drawing Sheets

(56) References Cited

U.S. PATENT DOCUMENTS

| | | | |
|---|---|---|---|
| 2009/0241578 A1* | 10/2009 | Carlson et al. | 62/259.2 |
| 2010/0076607 A1* | 3/2010 | Ahmed et al. | 700/276 |
| 2010/0154448 A1* | 6/2010 | Hay | 62/175 |
| 2010/0263830 A1* | 10/2010 | Noteboom et al. | 165/80.2 |
| 2011/0138708 A1* | 6/2011 | Chazelle et al. | 52/173.1 |
| 2011/0207391 A1* | 8/2011 | Hamburgen et al. | 454/184 |
| 2011/0240497 A1 | 10/2011 | Dechene | |
| 2012/0041600 A1* | 2/2012 | Michael et al. | 700/276 |
| 2012/0103843 A1* | 5/2012 | Wei | 206/320 |
| 2012/0127653 A1* | 5/2012 | Keisling et al. | 361/679.46 |
| 2012/0140407 A1* | 6/2012 | Chang | 361/679.49 |
| 2012/0142265 A1* | 6/2012 | Wei | 454/184 |
| 2012/0161340 A1* | 6/2012 | Sween | 261/26 |
| 2012/0171943 A1* | 7/2012 | Dunnavant | 454/184 |
| 2012/0300391 A1* | 11/2012 | Keisling et al. | 361/679.46 |
| 2012/0302150 A1* | 11/2012 | Schmitt et al. | 454/184 |
| 2013/0083476 A1* | 4/2013 | Clidaras et al. | 361/679.41 |
| 2013/0188310 A1* | 7/2013 | Noteboom et al. | 361/679.48 |

* cited by examiner

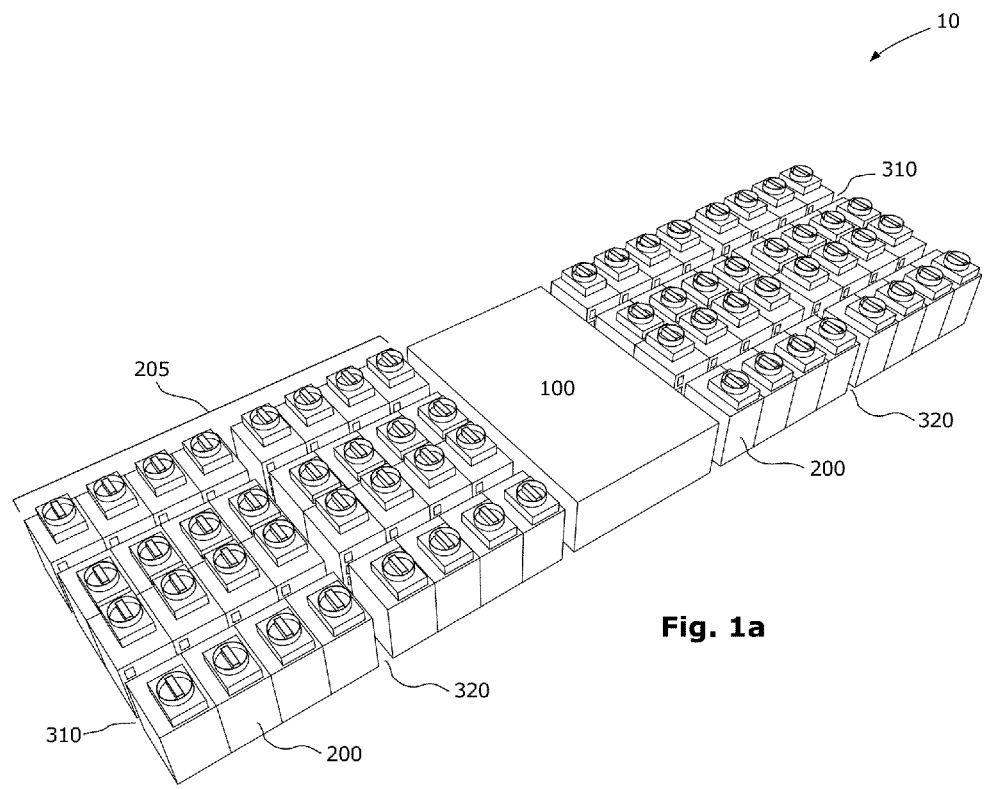
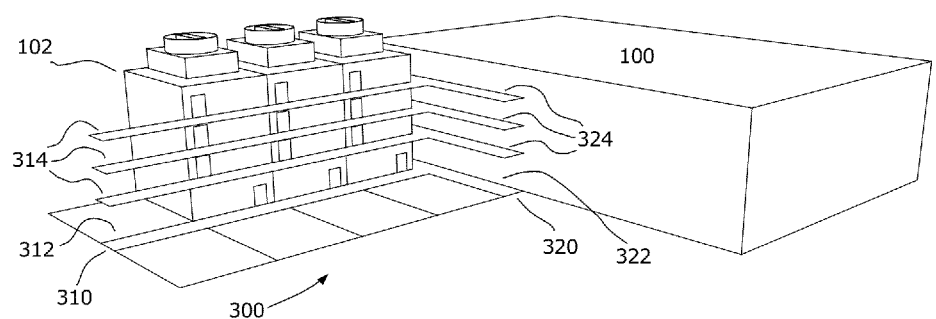

PREFABRICATED VERTICAL DATA CENTER MODULES AND METHOD OF LARGE-SCALE DEPLOYMENT

CROSS-REFERENCE TO RELATED APPLICATIONS

The present patent application claims the benefits of priority of U.S. Provisional Patent Application No. 61/736,270, entitled "Prefabricated Energy Efficient Data Center Condominiums and Method of Large Scale Deployment" and filed at the United States Patent and Trademark Office on Dec. 12, 2012. The content of which is incorporated herein by reference.

FIELD OF THE INVENTION

The present invention generally relates to data centers and more particularly to modular data centers and data center modules.

BACKGROUND OF THE INVENTION

Modularity, scalability and flexibility are now essential requirements for efficient and cost effective data centers. Modularity is the building block that allows rapid on-demand deployment of infrastructures. Modularity minimizes capital expenditure and, thus, maximizes return on investment (ROI). Scalability relates to modularity, but is the additional key that enables a design to scale past the barrier of a predetermined fixed number of modules. It is the glue that allows the different types of modules to coherently scale: specifically computing modules with floor/space modules, power modules, and cooling modules. Flexibility further refines modularity and scalability by allowing any type of hardware from any vendor, with various power and cooling requirements, to coexist within the same data center. It is most crucial in the context of serving multiple independent users choosing to collocate their specific computing machinery in a shared data center.

Recent power density increases in computer packaging are amongst the greatest limiting factors of scalability and flexibility in data centers. Current best practices suggest to partition large computing rooms into low, medium, and high power density zones. In this way, a limited form of scalability and flexibility can be reached, negating the need to overprovision the whole computing room with the highest possible power density capability. Nevertheless, forcing these zones to be sized a priori is hardly modular. The problem lies with the conventional data center design where a huge computing room is surrounded by proportionally sized mechanical and electrical rooms. Such arrangements are difficult to scale, because large distances limit our ability to efficiently distribute low voltage power to computing machinery, and move enough air to keep this machinery cool. Air cooling at large scales especially becomes daunting, because air velocity needs to be kept at acceptable levels using air conduits with limited cross-sections. Too much air velocity brings turbulence that in turn produces pressure differentials and, thus, non uniform air distribution and poor cooling efficiency. Moving water over large distances is both much easier and efficient. However, bringing water all the way to the computer cabinet (or even inside the cabinets) creates other challenges like leak detection and proofing.

Another popular trend is to use shipping containers to host preconfigured and preassembled computing hardware. Although this approach can be very modular and, to some extent, scalable, it is not so much flexible. The physical dimensions of a standard shipping container impose severe space constraints that usually limit the computer form factors that can be hosted while rendering hardware maintenance operations more difficult. Promoters of this approach are often hardware vendors of some sort, using the container model to push their own hardware as the backbone of data centers. Container based data centers are most practical when computing resources need to be mobile for some reason. In practice, however, even though rapid initial deployment is an obvious competitive advantage, rapid redeployment is a rare requirement because of the relative short lifespan of computers. Moreover, there is the additional issue of the low voltage power feeds usually required by these containers that have limited space for in-container power transformation. For large scale configurations, this forces either to inefficiently carry low voltage energy over large distances, or to combine computing containers with power transformation containers.

Finally, energy efficiency is also a very important requirement for modern data centers, both because of its financial and environmental impact. The two main sources of power losses in data centers lie in voltage transformation and regularization, on the one hand, and heat disposal, on the second hand. Best practices for efficient electrical systems are to minimize the number of voltage transformation stages and to transport energy at higher voltage. Also, it is important to correctly size the electrical infrastructure according to effective needs, as underutilized electrical systems are usually less efficient. As for efficient heat disposal, there are mostly air-side and water-side economizers to exploit favorable outside climate conditions to totally or partially circumvent the need for power hungry chillers. The holistic problem, however, is how to design cost-effective and energy efficient data centers that are also modular, scalable, and flexible.

In view of the foregoing, there is a need for an improved data center module which mitigates at least some shortcomings of prior data center modules.

SUMMARY OF THE INVENTION

A data center module in accordance with the principles of the present invention generally mitigates at least some of the shortcomings of prior data center modules by comprising multiple levels configured to accommodate both the cooling and the electric subsystems and the computing machinery (e.g. servers), and by being configured to be deployed with other identical data center modules around a central shared facility.

A data center module in accordance with the principles of the present invention generally comprises a compact-footprint weatherproof envelop, complete with party walls and staging areas, and a multistory energy efficient layout capable of powering and cooling typically generic computer hardware. The module therefore generally comprises all necessary voltage power transformation, power regularization (e.g. UPS), power distribution, and cooling subsystems. This configuration generally allows the simultaneous optimization of the power capacity density and hosting flexibility at very large scales.

In typical yet non-limitative embodiments, the data center module is configured to be prefabricated and be deployed in clusters of other identical (at least externally) data center modules juxtaposed both side-by-side and back-to-back without interleaving between adjacent modules.

In typical yet non-limitative embodiments, the data center module has a 30-feet by 40-feet footprint, e.g. the equivalent of three 40-feet long shipping containers laid out side-byside. It can accommodate different power density and cooling requirements in various redundancy configurations. It combines the advantages of the conventional "brick-and-mortar" data center with those of the container based data center, without their respective limitations. Typically using mostly standardized off-the-shelf electrical and mechanical components, it is modular and prefabricated to allow fast on-demand deployments, adding capacity in sync with user needs. It can efficiently host most any type of computing equipment with any type of power density requirement. For instance, power densities of over 30 kilowatts per cabinet are possible using air-cooled computer hardware. Cabinets that require chilled-water feeds, for instance to support rear-door heat exchangers, are also possible, even though rarely required if designed for front-to-back air circulation. Moreover, low density cabinets can coexist side-by-side with high density ones, without creating cooling problems. For maintenance, large aisles are provided for unconstrained access to both the front and rear of compute cabinets.

Typically, a module has a ground floor for hosting its power and cooling subsystems, and several upper floors for hosting its computer cabinets. It is designed to be self-contained and weatherproof. Its maximum power envelope is determined by the capacity of its user specified electrical infrastructure (up to 1.2 megawatts for a typical 30-feet wide unit). Given this infrastructure, the number of upper floors can be adjusted to match the power density requirements: less floors for higher density; more floors for lower density. The data center modules are designed to accommodate any size of air-cooled computer cabinets, as long as air circulation is front-to-back. The maximum allowable number of cabinets is a function of the cabinet width and of the number of upper floors. For instance, a 30-feet wide by 40-feet deep unit provides up to two 32-feet rows of linear space that can accommodate up to 32 standard size (24-inch wide; 15 per row) cabinets per floor. The average allowable power dissipation per cabinet is simply determined by dividing the total power envelope of the module with its total number of cabinets. For instance, a module with a 1.2 megawatts power envelop and three computing floors can host up to 96 cabinets, each dissipating 12.5 kilowatts on average. With four floors, 128 cabinets could be accommodated with an average power consumption of 9.4 kilowatts. The cooling system allows for any mixture of low, medium or high power density cabinets, as long as the total power consumption is below the power envelope of the module.

Herein, low power density typically refers to 5 kilowatts or less per cabinet, medium density typically refers to between 5 and 15 kilowatts per cabinet, and high density typically refers to more than 15 kilowatts per cabinet. However, such ranges are likely to change over time.

In accordance with the principles of the present invention, though each data center module is mostly autonomous, it is configured to be deployed around a central facility responsible for providing reliable low or medium voltage power feeds that can efficiently be carried over distances of several hundreds of feet to modules, in a cost-effective and energy efficient way.

Herein, low voltage is typically defined as below 1 kilovolt, while medium voltage is typically between 1 and 30 kilovolts. The central facility typically includes the usual medium voltage power generators and transfer switch-gears that provide backup energy in case of grid failure. It can also include any high-to-medium voltage transformation gear that is necessary if the utility company energizes the central facility with a high voltage power line. Herein, high voltage typically refers to above 30 kilovolts.

The central facility typically further includes high efficiency modular chilled-water production subsystems, optimized for the local climate using water towers or any other water-side economizer mechanisms. The rational for centralizing the chilled-water service revolves around the following three motivations. First, on a yearly basis, it is expected that most of the cooling necessary for a module can be realized using an air-side economizer cycle based on outside fresh air. Thus, there is no need for providing necessarily undersubscribed and inefficient local chilled-water production capacity. The air-side economizer cycle is built into the prefabricated module because, contrary to water, air cannot efficiently be distributed over large distances; it needs to be handled locally. Second, large industrial chillers can be made very efficient, much more than any other direct exchange (DX) cooling system small enough to fit inside a module. If all cooling cannot be realized using an air-side economizer cycle, centralizing the chilled-water production is still an effective way of minimizing the power usage efficiency (PUE) of the data center. Third, if it is practical to reuse the heat generated by the computing machinery for other means, for instance to heat adjacent buildings during winter, then the chilled-water loop must also be centralized to maximize the energy reuse effectiveness (ERE) of the data center complex.

Thus, whenever practical, to enable energy reuse, the central facility can signal the modules that they should use as much chilled-water as necessary, by recycling the wasted hot air in a closed-loop, transferring the corresponding energy into the water return of the chilled-water loop. Otherwise, if no more energy reuse is possible, the modules will try to minimize the PUE by using as little chilled-water as possible, instead favoring free air cooling, breathing outside fresh air, circulating this air through computer cabinets and exhausting the wasted hot air to the outside.

Finally, the central facility is also responsible for providing other shared services, for instance points of presence for Internet providers, security check points and biometric access controls, loading docks, meeting rooms, etc.

In typical yet non-limitative embodiments, the central facility is connected to scalable clusters of data center modules using segregated passage ways for power feeds, chilled-water loops, communication network cables (e.g. fiber-optic cables), and human access. Data center modules are typically juxtaposed on both sides of a multistory corridor structure. The ground level corridor generally provides human access to the power and cooling subsystems, while the upper floor corridors are for accessing the computing levels. The chilled-water loop is typically placed underground, below the first corridor, while the power feeds are routed in the false ceiling of the same corridor. All communication network cables are typically routed in the false ceiling of the second level corridor.

In typical yet non-limitative embodiments, the data center module comprises an efficient cooling system combining in a single hybrid system the efficiency of both air-side and water-side economizers, without multiplying the number of system components. The air-side mode of operation, where the heat dissipated by the computing machinery is rejected into the atmosphere, is preferred when there is no practical way to reuse this heat, while the water-side mode of operation is used if the heat can be reused, for example to heat other nearby buildings. The system can efficiently operate partially in both modes (hybrid mode) when only part of the generated heat can be reused in a practical way.

The particular vertical, i.e. multistory, configuration of the data center module allows for cost-effective usage of a small number of large mechanical components that both increase efficiency and reliability, contrary to previous modular systems that rely on many more smaller components because of either cramped space constraints, or because forced-air circulation over long distances is too inefficient.

Other and further aspects and advantages of the present invention will be obvious upon an understanding of the illustrative embodiments about to be described or will be indicated in the appended claims, and various advantages not referred to herein will occur to one skilled in the art upon employment of the invention in practice. The features of the present invention which are believed to be novel are set forth with particularity in the appended claims.

BRIEF DESCRIPTION OF THE DRAWINGS

The above and other aspects, features and advantages of the invention will become more readily apparent from the following description, reference being made to the accompanying drawings in which:

FIG. 1a presents a perspective view of an embodiment of a large scale data center complex with a central facility building and 2 clusters of 32 prefabricated data center modules each, connected by a grid of corridors, in accordance with the principles of the present invention.

FIG. 1b presents a perspective view of an embodiment of a central facility building with three data center modules, but with a corridor section and concrete slab ready for appending 5 additional prefabricated data center modules.

DETAILED DESCRIPTION OF THE PREFERRED EMBODIMENT

Figure 2:
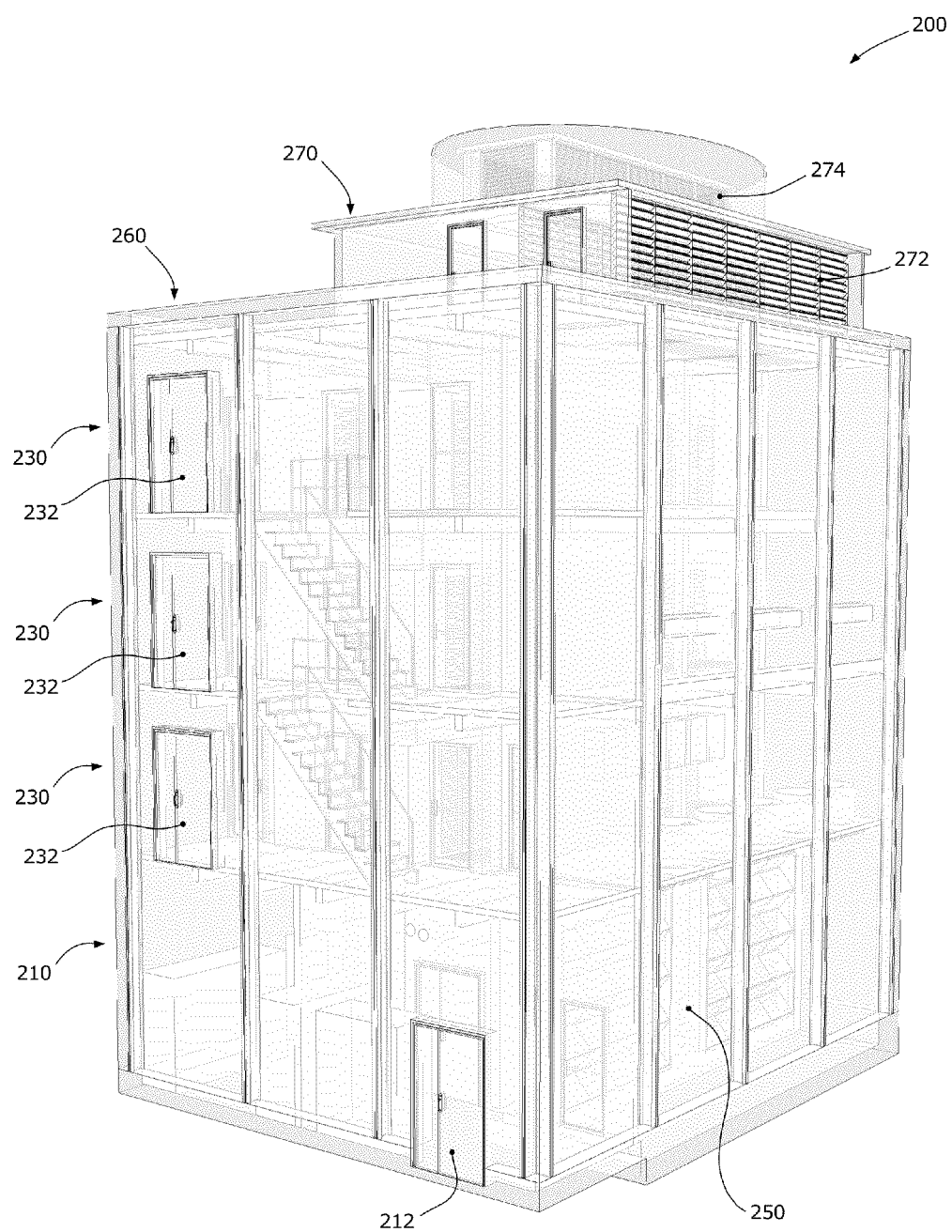
FIG. 2 is a perspective view of an embodiment of a four-story prefabricated data center module in accordance with the principles of the present invention, the module comprising a ground floor for power and cooling subsystems, and three upper floors for computing machinery.

Novel prefabricated data center modules and a method of their large-scale deployment will be described hereinafter. Although the invention is described in terms of specific illustrative embodiments, it is to be understood that the embodiments described herein are by way of example only and that the scope of the invention is not intended to be limited thereby.

Referring to FIG. 1a, a module-based data center complex is shown at 10 to be composed of a main facility building 100 surrounded by clusters 205 of prefabricated data center modules or units 200. In this case, 2 clusters 205 of 32 modules 200 each. The central facility 100 hosts the services that are shared by the modules 200: low or medium voltage power feeds, chilled-water feeds, demineralized water for humidity control, Internet connections, security check points with biometric access controls, washrooms, meeting rooms, etc.

The data center modules 200 are linked to the central facility 100 by a grid of corridors 300 that not only insure secure human access, but also serve as passageways to distribute shared services.

The topology of module clusters 205 is not limited to the example shown in FIG. 1a. In general, clustered modules 200 are juxtaposed on each side of a main corridor 310, with possible orthogonal secondary corridors 320, to both minimize the total footprint of clusters 205 and the distances over which services must be carried. However, any other topology can be used to accommodate different shapes of land. To maximize flexibility, the data center modules 200 are designed to be juxtaposed side-to-side and back-to-back without wasting any real estate as shown in FIG. 1a.

The data center modules 200 are multistory to maximize density and decrease distances. The ground floor is used for mechanical and electrical subsystems, while the upper floors host the computing machinery (e.g. servers). The modules 200 are mostly autonomous; they only require a power feed and a chilled-water feed provided by the central facility 100. They have their own voltage transformers, UPS(s), power distribution, and cooling system. All controls are embedded within each module 200, but can be monitored and operated from the central facility building 100, or remotely through secure network access.

The corridors 310 and 320 that link the main building 100 to the data center modules 200 are also multistory. The ground level corridors 312 and 322 provide human access to the ground level of the modules 200 while the upper floor corridors 314 and 324 are for accessing the upper computing levels (see FIG. 1b). All water feeds are typically carried under the ground level corridors 312 and 322, and all power feeds are typically carried in the false ceiling of the same corridors. In this way, the effect of a water pipe fracture is minimized. All communication network feeds are routed in the false ceiling of the above ground corridors 314 and 324.

In FIG. 1b, three existing modules 200 are shown connected to the central facility building 100 by a corridor section 310 that can accept 5 additional modules; 1 on the same side of the corridor 310 as the first three modules 200, and 4 on the opposite side. It should be noted that this corridor 310 is drawn with its walls removed for illustration purposes. In reality, it would be closed on both sides with reusable party walls.

This figure also illustrates the fact that a module-based data center complex 10 can be assembled on-demand, one module 200 at a time, after having built a corridor section 310. Not shown are the emergency exits that are typically located at the end of corridors 310 and 320.

Referring to FIG. 2, each prefabricated data center module 200 comprises a ground level 210 for power and cooling subsystems, and several stories 230 for computing machinery. In this particular case, three computing stories 230 are shown. Each floor has an access door in the front, one door 212 on the ground floor, and one door 232 on each of the upper floors 230. The ground level door 212 gives access to the module 200 power and cooling subsystems, while the upper level doors 232 provide access to the computing machinery. They open into the corridor passageways 312 and 314 of FIG. 1b.

A module 200 has a weatherproof prefabricated weight bearing exterior shell or envelop 250 designed to be shared by adjacent modules 200. In other words, in the present embodiment, a module 200 built adjacent to an existing module 200 will share a wall with the existing module 200, thereby reducing costs and wasted spaces. Still, in other embodiments, each module 200 could have its own exterior envelop 250 without sharing adjacent wall(s).

The corridors 310 and 320 also share this modular structure so that a large scale data center complex 10 can be rapidly and efficiently assembled one module 200 at a time.

Still referring to FIG. 2, an air handling unit 270 is located on the rooftop 260 of the module 200 to allow an optimized cooling system that can benefit from both air-side or water-side economizers, while effectively minimizing its real-estate footprint. When climate is favorable, the cooling system draws outside air through one or more intake vents 272 and moves this cold air downward to the ground floor 210. The cold air is then pushed upwards to cool the computers located on the upper floors 230, and the generated hot air is either exhausted through one or more exhaust vents 274 located at the top part of the air handling unit 270, or recirculated by mixing it with the intake air. The air handling unit 270 is designed in such a way that exhausted air cannot recirculate through the intake vents 272. In that sense, the exhaust vents 274 of the air handling unit 270 are located higher than the intake vents 272 as best shown in FIG. 2. Moreover, the air intake is recessed from the module's side so that adjacent modules 200 can be attached side-by-side without wasting any interleaving space at the ground level, and without any mutual interference. Both intake and exhaust vents 272 and 274 are respectively equipped with motorized dampers 276 and 278 (see FIG. 6) that can control their effective cross-sections and, thus, the volume of air per unit of time that can enter and exit the module 200. When climate is unfavorable, or if there is a possibility of heat reuse, these dampers 276 and 278 are fully closed and the cooling system uses the chilled-water loop provided by the central facility 100 to cool the closed-loop recirculated air.

Figure 3:
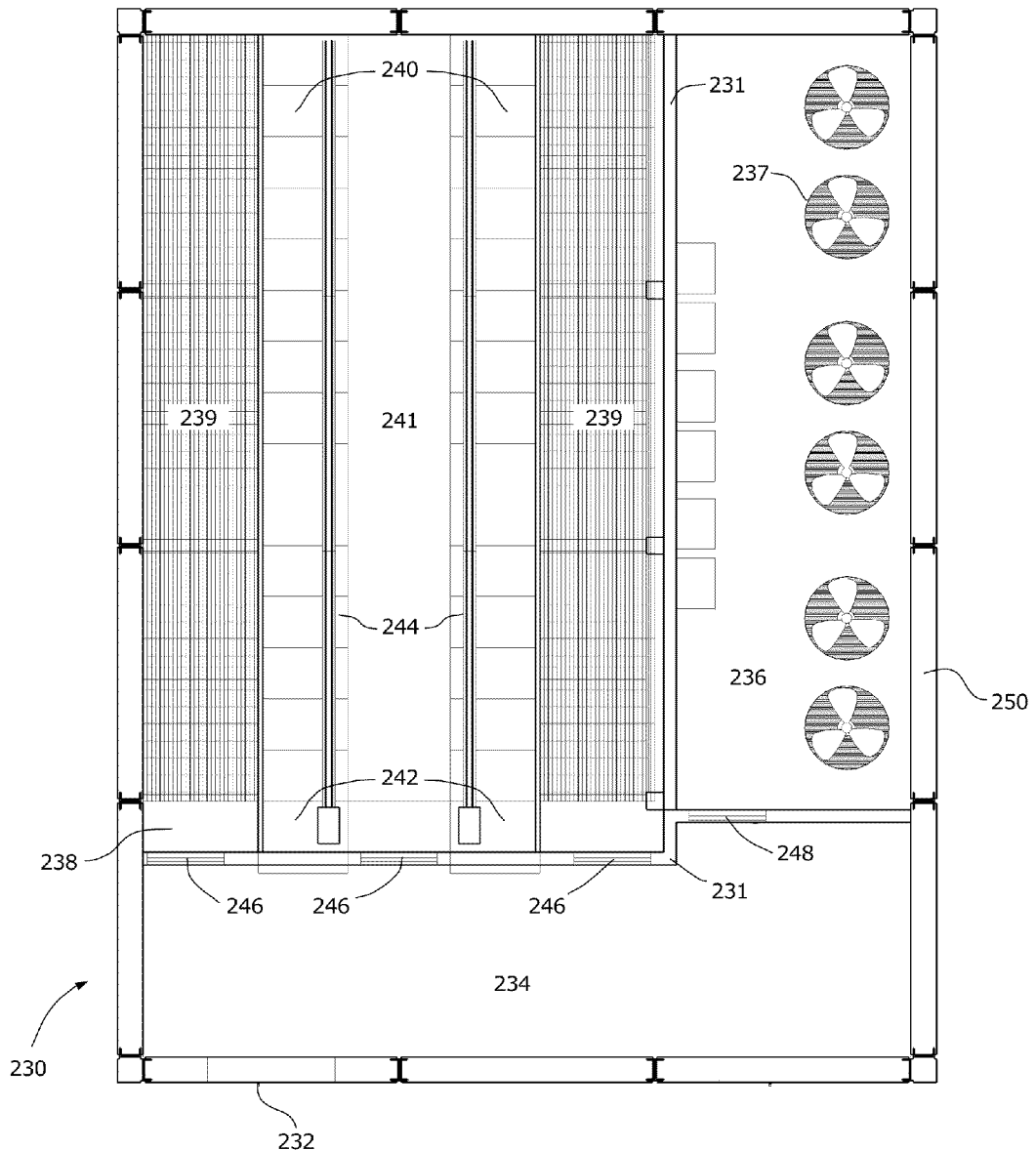
FIG. 3 is a plan view projection of the first upper floor of the prefabricated data center module of FIG. 2, where computing equipments (e.g. servers) are located.

FIG. 3 gives a plan view projection of the first upper floor 230 of the module 200. Each upper floor 230 is divided into three rooms or areas by a drywall 231. The first room is a general purpose staging area 234 that communicates with the external access corridor through the entrance door 232. The second is an air handling area 236 that links the rooftop air intake 272 to the ground floor 210. The air handling area 236 typically comprises one or more fans 237 for pushing the air from the air handling unit 270 toward the ground floor 210. The third is a computing room 238 that comprises, in the present embodiment, two cold-aisles 239 separated from a central hot-aisle 241 by two parallel rows of computer cabinets 240. Understandably, in other embodiments, the number of cold-aisle(s), hot-aisle(s) and row(s) of computer cabinets could be different. For example, in some embodiments, there could be one cold aisle, one hot aisle, and one row of computer cabinets, and in still other embodiments, there could be three cold-aisles, two hot-aisles and four rows of cabinets.

Three doors 246 provide access from the staging area 234 to the three aisles 239 and 241 of the computing room 238, and a fourth door 248 is for accessing the air handling area 236.

Through grating in the floor (see also FIG. 6), the cold-aisles 239 are connected from the ground floor 210 to the top floor 230, creating a vertical plenum of cold air. The central hot-aisle 241 is connected from the first floor 230 to the rooftop air handling unit 270, forming another vertical plenum. By traversing the compute cabinets 240, from cold-aisle 239 to hot-aisle 241, the computing machinery can effectively be cooled by transferring the generated heat to the airflow.

For a typical 30-feet wide by 40-feet deep module 200, there is room for 32 linear feet of cabinets 240 per row, which is enough to host up to 32 standardized 24-inch wide cabinets 240 per floor. The last cabinet 242 at the end of each row 240, the one nearest to the drywall 231, can be used to accommodate any necessary voltage transformers. Power is typically distributed to the compute cabinets using overhead busbars 244.

Wider modules 200 can accommodate more cabinet aisles 240 using the same principle. Similarly, deeper modules 200 can accommodate longer aisles with more cabinets 240 per row.

The maximal power envelop of a module 200 is determined by two main limiting factors: the capacity of its power and cooling subsystems (transformers, UPSs, fans, and coils) and the width of the grating section of its cold-aisles 239 on the first floor 230, which determines the maximum velocity of the upward air flow. This is a limiting factor, because too much velocity creates turbulence which in turn induces differences in pressure and temperature. It typically needs to be kept under 5 meters per second (1000-feet per minute) so that the cold-aisle 239 can behave as a plenum and, thus, eliminate all possibilities of non-uniform cooling. For the typical module 200 of FIG. 3 with its 4-feet and a half wide cold-aisles 239, assuming that compute servers can effectively be cooled using an airflow of 100 CFM per kilowatt of heat dissipation, at 20-degree Celsius, this translates to a possible power envelop of up to 2.4 megawatts for 96 cabinets, or 25 kilowatts per cabinet on average. For a more typical configuration with cabinets dissipating on average 12 kilowatts, the maximum air velocity drops well below the critical threshold.

As for air velocity in the central hot-aisle 241, it is much less critical, because turbulence there will not affect the cooling of the computing machinery.

Notably, this configuration enables the electrical subsystems of the module 200 to be air-cooled with the same system used for cooling the computing machinery. No addition components are necessary.

Figure 4:
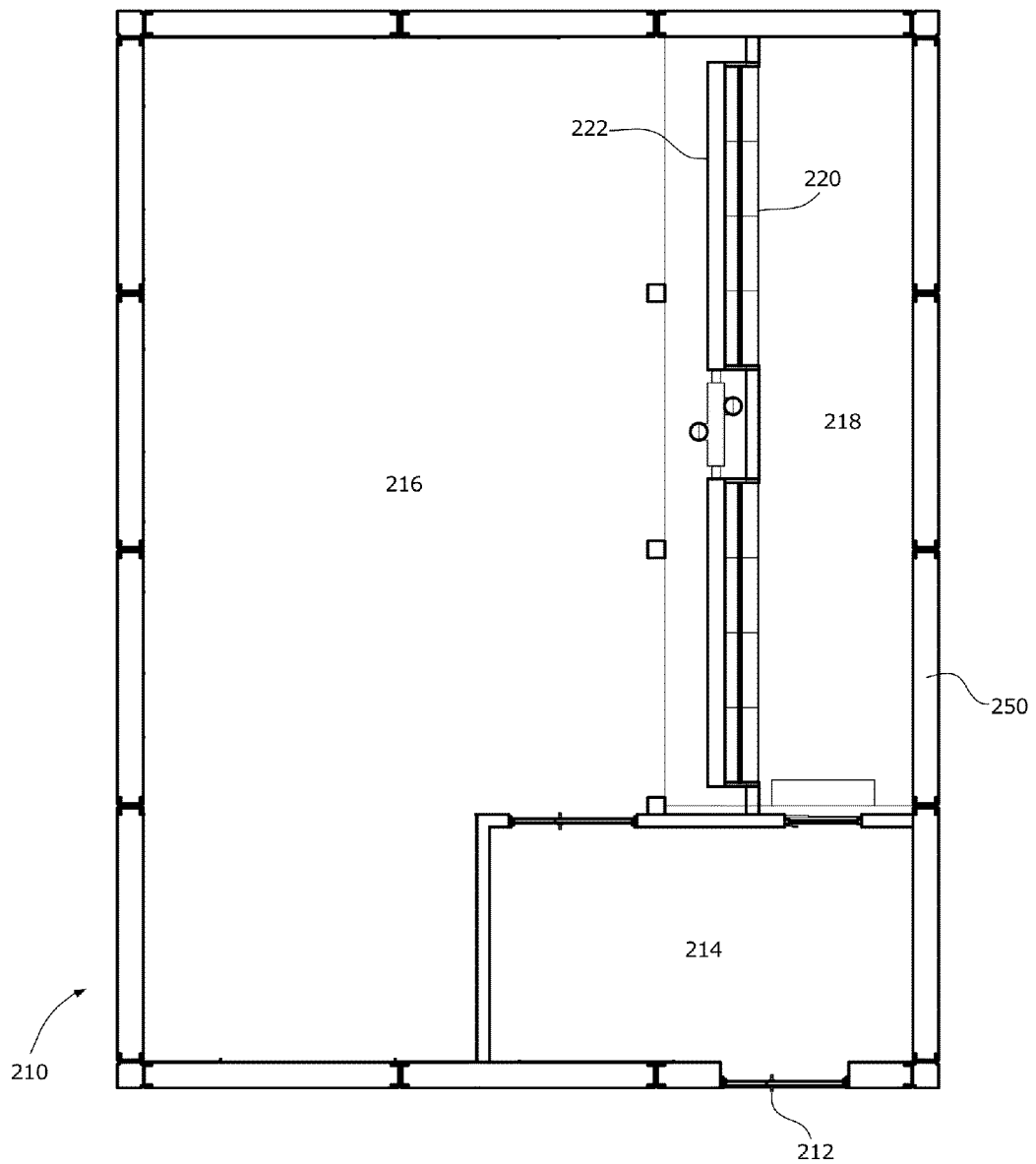
FIG. 4 is a plan view projection of the ground floor of the prefabricated data center module of FIG. 2, where the power and cooling subsystems are located.

Referring to FIG. 4, the ground floor 210 of the module 200 is also divided into three rooms or areas: an entrance hall 214 that can host fire protection systems, for instance, an electrical room 216 that can host heat producing electrical components like transformers and UPSs, and a positive pressure intake plenum area 218. The airflow is forced downward from the above air handling area 236 (see FIGS. 3 and 6) using a set of variable drive fans 237. It then traverses to the electrical room 216 through filters 220 and cooling coils 222 before moving upward through the grating floor of the above cold-aisles 239, carrying any heat dissipated by the electrical components located in the electrical room 216.

Figure 5:
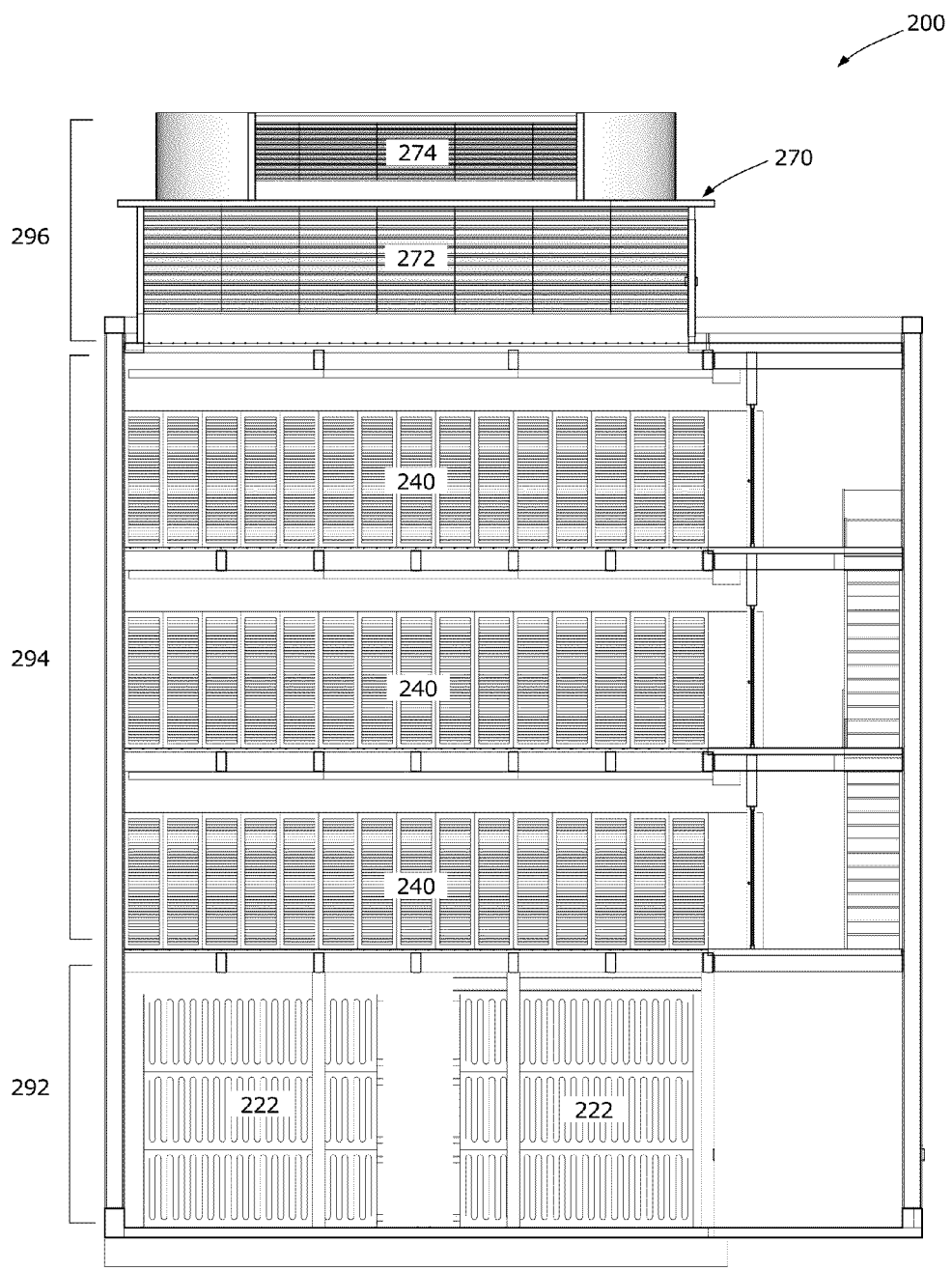
FIG. 5 is an elevation side view of the prefabricated data center module of FIG. 2 that shows part of the cooling subsystem on the ground floor and the arrangement of computer cabinets on the upper floors.

Referring to FIG. 5, the module 200 is divided logically into three vertical parts: a lower part 292 for the electrical and mechanical components, including cooling coils 222, a multilevel middle part 294 for the computing machinery 240, and an upper part 296 for the air handling unit 270 with its intake vents 272 and exhaust vents 274.

Figure 6:
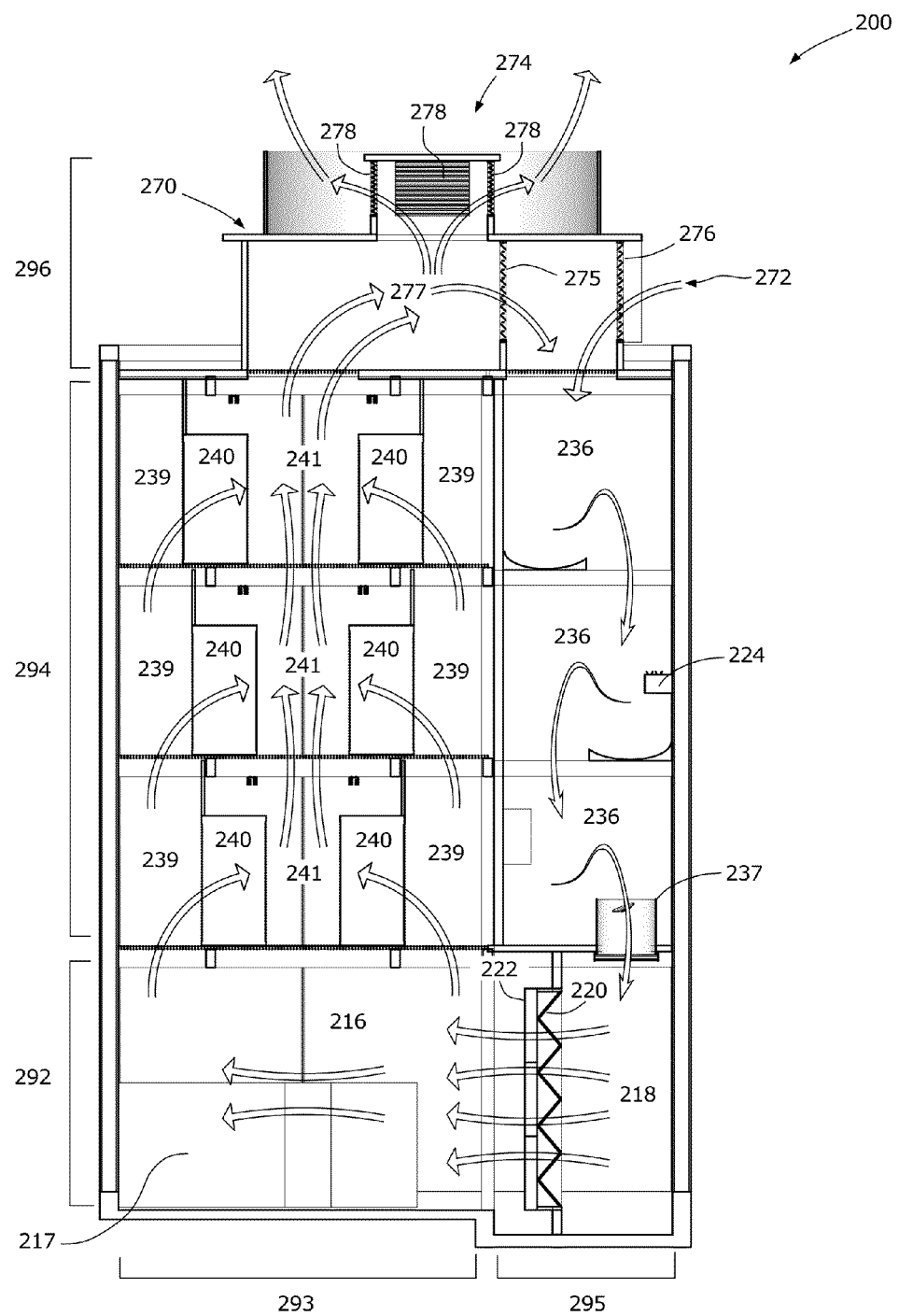
FIG. 6 is an elevation front view projection of the prefabricated data center module of FIG. 2, illustrating its different internal airflow patterns.

FIG. 6 provides a detailed elevation view of the various airflows inside the present embodiment of the data center module 200. It indicates the three vertical parts of the module:

lower part 292, middle part 294 and upper part 296; and illustrates that each part can be further subdivided into a left-hand side 293, and a right-hand side 295. It shows the different system components: filter banks 220, cooling coil sets 222, variable drive fans 237, humidifiers 224, intake vent 272 with dampers 276, exhaust vent 274 with dampers 278, computing cabinets 240, upward vertical hot-aisle 241, upward vertical cold-aisles 239, air mixing dampers 275, downward mixing plenum 236, input plenum 218, cold plenum 216, exhaust plenum 277, and optional UPS submodule (s) 217.

Starting from the input plenum 218 that is under a positive pressure created by the fans 237, the air first crosses the filters banks 220 and coils 222. Depending on the mode of operation, this input air can be either hot or cold. In closed-loop operations, being recirculated from the hot-aisle 241 through the exhaust plenum 277, mixing dampers 275, and mixing plenum 236, the air is warm and may need to be cooled by the coils 222. In hybrid-loop operations, coming mostly from the outside through the intake vent 272, it may be cold enough to not require any cooling, but it may also be too cold. In that case, it is heated using the warm air from the exhaust plenum 277, by mixing part of it through the mixing dampers 275. Then, whatever warm air from the exhaust plenum 277 not used for mixing will naturally exit through the exhaust vents 274.

Once the air crosses to the central cold plenum 216, it can rise through the grating floors of the cold-aisles 239 and reach the servers in the computer cabinets 240. From there, through the computer cabinets 240, it crosses to the hot-aisle 241, absorbing the heat dissipated by the servers. The rows of cabinets 240 need to form a sealed barrier between the cold-aisles 239 and hot-aisle 241, effectively limiting any horizontal air movement to the computer servers inside the cabinets 240. Specifically, lightweight filler panels installed above the cabinets 240 serve this purpose. This is another key to efficient air cooling, avoiding any mixture of cold and hot air outside of computer cabinets 240. Inside the cabinets 240 themselves, depending on their design, some weather striping materials can also be used to fill smaller holes.

Once in the hot-aisle 241, the air is free to rise through the gratings to the exhaust plenum 277 where it is either recirculated downward through the mixing dampers 275 and mixing plenum 236, or exhausted upward through the exhaust vents 274, depending on the modes of operation previously described.

Notably, the cooling system of the present embodiment of the module 200 can be built from standardized industrial parts readily available and manufactured in large quantities at low cost. Its global efficiency stems from the use of large capacity and high efficiency fans 237 and coils 222 that can be made much more efficient than their smaller counterparts usually found in conventional computing room air conditioner (CRAC) units. Moreover, the whole module 200 can be assembled rapidly from manufactured parts using well known and mastered metal structure building techniques. External party walls and weight bearing structures of modules 200 can be designed so that a new module 200 can attach to an existing one. Similarly, corridors 310 and 320 can be designed in a modular fashion so that new sections can be added with new modules 200.

Furthermore, each module 200 comprises its own electrical systems, complete with voltage transformations, switch gear protection, and UPS 217, possibly in 1n, n+1 or 2n redundant configurations. The ability to regroup all mechanical and electrical systems in a single autonomous module 200 is not only cost effective, it is scalable and flexible. A module operator can customize the capacity and resiliency of his module 200 to satisfy the specific needs of his users, without affecting the operations of other modules 200. For instance, some modules 200 could operate with either no, partial, or full UPS protection, with or without redundancy. A priori decisions need not be taken for the whole site, nor do power density zones need to be defined. Decisions can be postponed to time of deployment, one module 200 at a time, or in blocks of multiple modules 200. Modules 200 can be built on-demand. Upgrades of existing modules 200 are also feasible without affecting the operations of others. For instance, transformers could be upgraded to change from a 1n configuration to an n+1 configuration, or a UPS could be added, or support extended, if needs evolve over time.

Power distribution to computer cabinets is also flexible. It can rely on different technologies like classical breaker panels, busbars, or in-row PDU cabinets. Again, the choice need not be taken a priori for the whole site, but can be postponed to deployment time. The modularity of the module 200 allows for cost-effective and resilient evolution of the data center complex 10 over time.

The problem of cooling the heat dissipation of electrical components within the module 200 is also addressed by placing these components inside the cooling system, which is both a cost-effective and energy efficient solution. It then becomes a non-issue. The same is true for the control systems that include fan drives, valve controls, temperature sensors, differential pressure sensors, humidity sensors and controls, fire detection and protection, and access controls.

Figure 7:
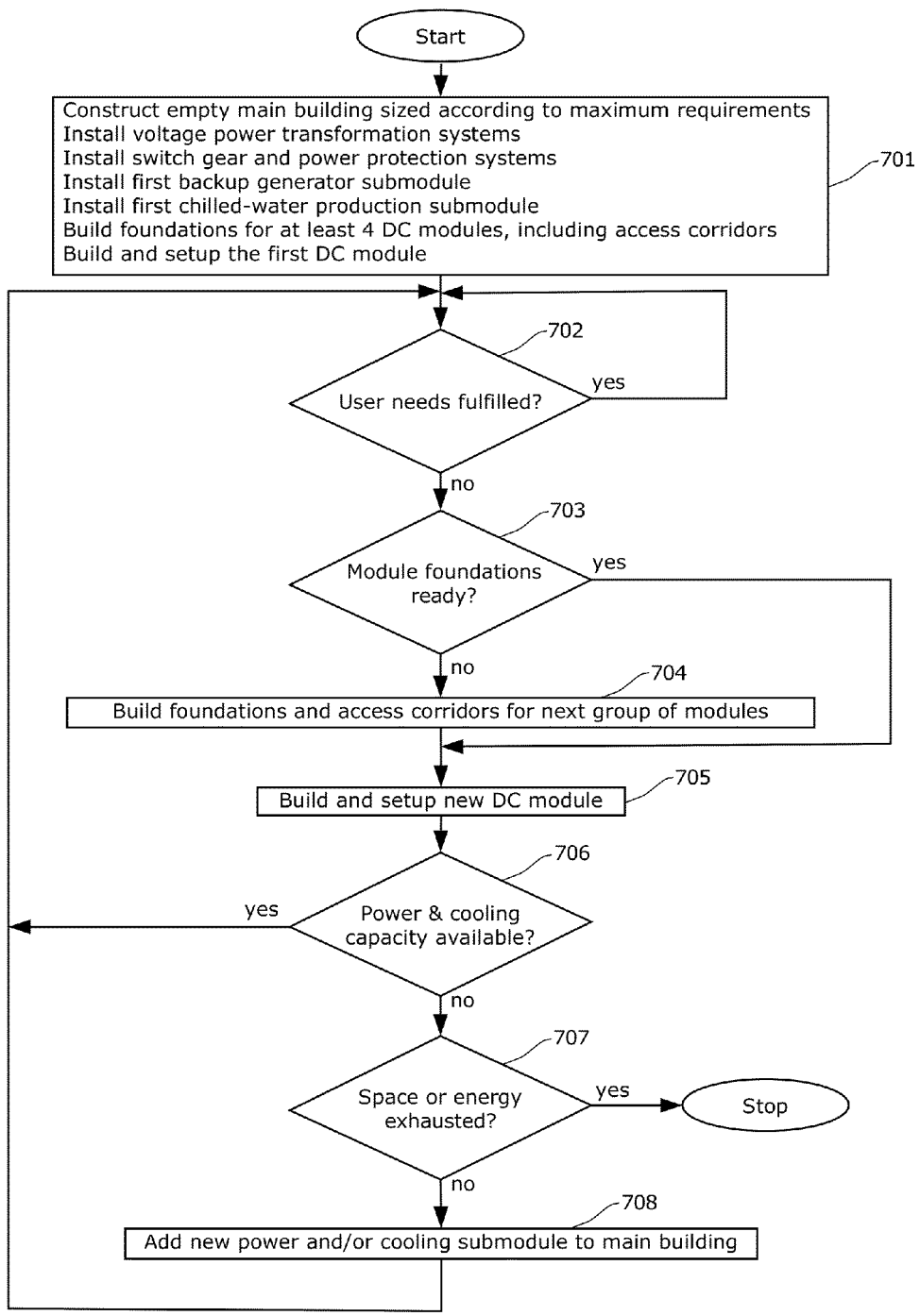
FIG. 7 is a flowchart that illustrates an exemplary method for deploying large scale data center module complexes in accordance with the principles of the present invention.

Referring to FIG. 7, the deployment method for a large scale data center complex 10 is described by a flowchart. The method bootstraps (at 701) by constructing the central facility building 100 for housing the main power and cooling infrastructures that are shared by all modules 200. This initial facility 100 is essentially an empty shell built on a concrete slab. It has some office space for administration, security, and maintenance staff, but most of its footprint is typically of low cost warehouse type. It must generally be sized according to the expected maximum power capacity of the whole data center complex 10. Then, the corresponding medium or high voltage power feeds from the utility company must be installed with adequate voltage transformation, switch gears, and protection systems. If possible, this step shall be phased to minimize initial investments. The important thing is to have enough switch gear to make sure that additional power capacity can be added without having to interrupt services to existing modules 200. Backup generators and chillers modules should generally be installed one by one, as user needs evolve, maximizing ROI. Building modules 200 requires a concrete slab with strong foundations because of the weight of the computing machinery. As building these foundations may take a somewhat long lead time, especially for locations where the ground freezes during winter, it may be wise to anticipate user needs and build them well in advance for at least several (e.g. 4) modules 200, including access corridors and passageways 310 and 320. Obviously, this number can be increased if rapidly changing user needs are expected. The last step of this initial work is to build and setup the first module 200 to address the initial user needs. Again, if these needs are initially greater, the number of initial modules 200 should be augmented accordingly.

Afterward, user needs are constantly assessed (at 702) and if no longer fulfilled, a new module 200 is ordered, factory built and assembled on existing foundations (at 705). If no foundations are available (at 703), or if not enough of them are currently available to address the expected short term needs, then new foundations are built in increments of typically 4 or more (at 704). If medium voltage power or cooling capacity is short in the central facility 100 (at 706), but space and energy is still available (at 707), then new power and/or cooling modules are added to the main building 100 (at 708). Otherwise, if power and cooling capacity for the new modules 200 is short and space or energy is exhausted, then the site has reached its capacity and a new data center complex 10 must be built on a new site.

Figure 8A:
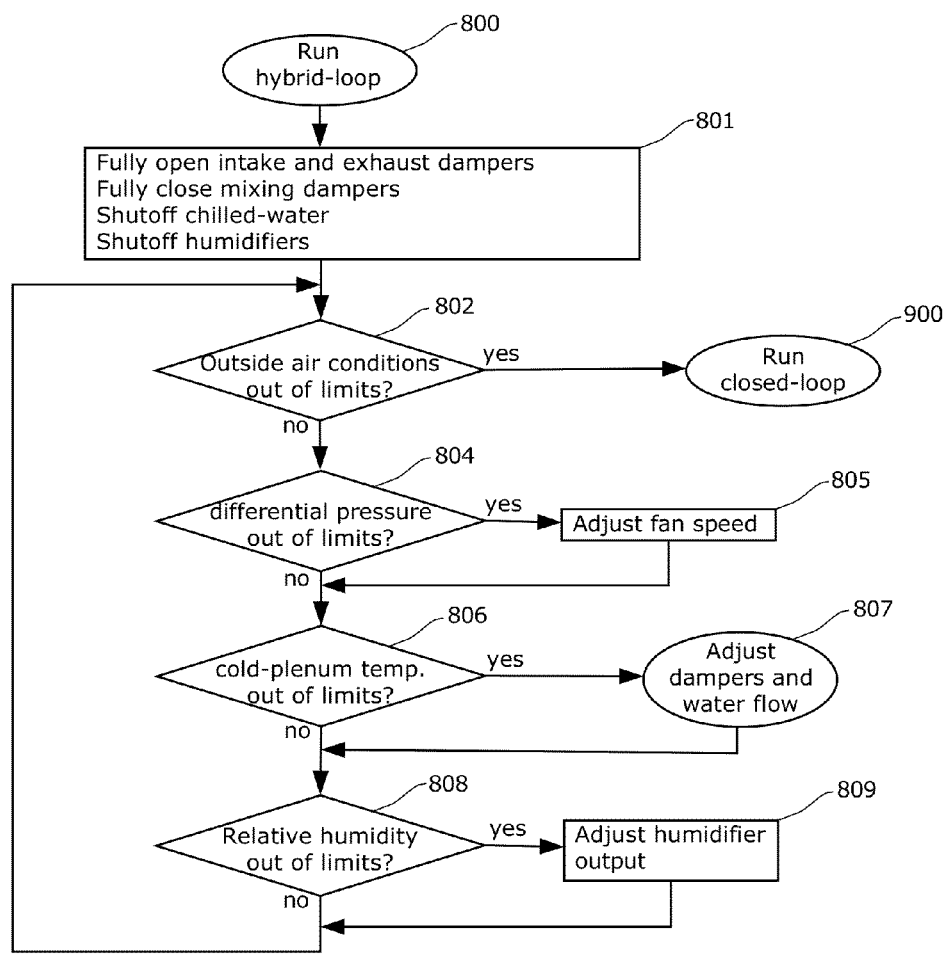
FIGS. 8a and 8b is a flowchart that illustrates an exemplary all-season hybrid-loop control method for the cooling system of the prefabricated data center module in accordance with the principles of the present invention.

Referring to FIG. 8*a*, the hybrid-loop control method 800 for cooling a module 200 is described with the help of a flowchart. This method 800 applies independently for each of the two cooling subsystems in the module 200. The method starts (at 801) by initially fully opening the intake and exhaust dampers 276 and 278, and fully closing the mixing dampers 275. The chilled-water valve is also initially closed so that no water is flowing through the coils 222. Finally, the humidifiers 224 are also initially shutoff.

Then, the method 800 enters a loop where outside air conditions are first evaluated. If temperature or humidity are out of limits ("yes" branch at 802), then the system may no longer operate in hybrid-loop and is automatically switched to closed-loop operation (see 900 of FIG. 9). Indeed, when the outside temperature nears the set-point temperature for the cold air plenum, the system can no longer operate in hybrid-loop in any practical way, so it reverts to closed loop operations. The decision can be implemented using either the outside dry bulb temperature or the more precise air enthalpy. If the outside conditions are favorable ("no" branch at 802), then the process continues by measuring the differential pressure on all floors 230, between the cold and hot aisles 239 and 241, for all cabinet rows 240. The lowest measurement is kept and used to adjust the fan speed (at 805) if the pressure is determined to be out of limits ("yes" branch at 804). The acceptable range of differential pressure is between two small positive values. In the case where the cold-aisles 239 are maintained at temperatures below 20 degrees Celsius, the lower end of this range should be approximately zero; if the cold-aisle 239 is operated at higher temperature, it may need to be somewhat above zero to maintain a more aggressive minimum differential pressure. The fan speed adjustment method uses standard control algorithms for this purpose.

The next step is to regulate the temperature of the cold-aisles 239 if it is outside of the preset limits (at 806). The temperature is measured at the output of the cooling subsystem in the central cold air plenum 216, below the first computing level 230. Four variables can be controlled to achieve temperature regulation: the flow of water in the coils 222, and the flow of air in the intake, exhaust, and mixing dampers 276, 278 and 275 respectively (at 807).

Figure 8B:
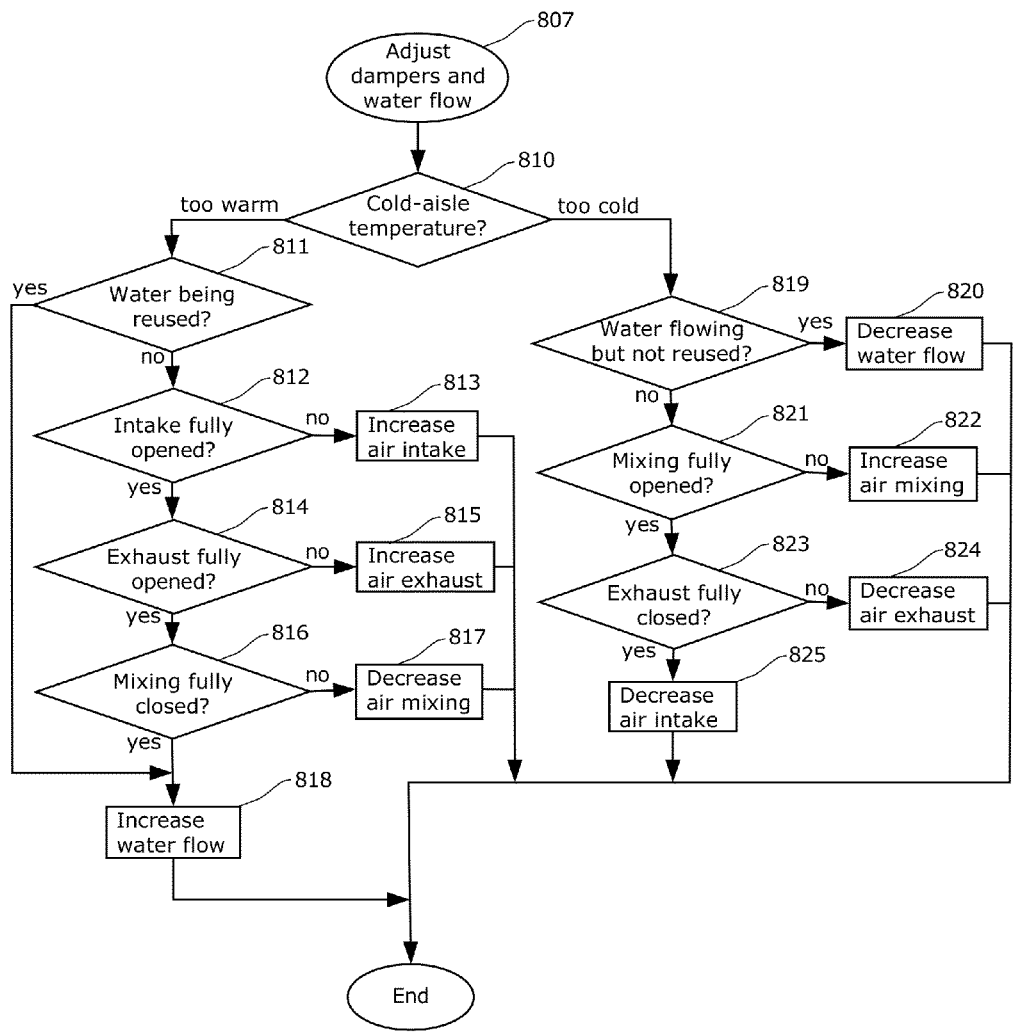

Referring to FIG. 8*b*, the method performed at 807 for adjusting the dampers and water flow is illustrated with a flowchart. When the current cold-aisle 239 temperature is too cold ("too cold" branch at 810), the method uses a strategy that prioritize the variables in the following order: water flow, mixing airflow, exhaust airflow, and intake airflow. If water is currently flowing, but not being reused by the central facility 100 ("yes" branch at 819), then its flow is decreased (820) to maximize the use of the air-side economizer cycle (which is the general objective of the hybrid-loop operation). Otherwise ("no" branch at 819), either no water is flowing, in which case flow cannot be reduced, or water is flowing, but needed by the central facility 100 for useful energy reuse. At this point, some warm air from the exhaust plenum 277 must be recirculated to further preheat the air in the mixing plenum 236. If the mixing dampers 275 are not yet fully opened ("no" branch at 821), then it is opened some more to increase air mixing (at 822). In this way, more of the warm air in the exhaust plenum 277 is mixed with the external cold air to raise the air temperature of the input plenum 218. On the contrary, if the mixing dampers 275 are already fully opened ("yes" branch at 821), then it is necessary to act on the exhaust dampers 278 by decreasing the flow of air that can exit the module 200 (at 824). In this way, more of the exhaust plenum air can mix with the outside air to raise the temperature in the input plenum 218. In the extreme case, the exhaust dampers 278 are fully closed ("yes" branch at 823) and all of the warm hot-aisle 241 air is recirculated. When this happens, there is a possibility that some of this warm air under pressure will exit through the intake vent 272 instead of being sucked downward in the mixing plenum 236, so the intake damper 276 cross-section needs to be decreased (at 825) to create a restriction that will force all the mixed air to flow downwards. It is not possible that the intake dampers 276 fully close unless no heat is dissipated by the computing machinery.

If the cold-aisle 239 temperature is too warm ("too warm" branch at 810), then the strategy is to prioritize the control variables in the reverse order: intake airflow, exhaust airflow, mixing airflow, and water flow, assuming that water is currently not being reused by the central facility ("no" branch at 811). If the intake dampers 276 are not fully opened ("no" branch at 812), then they should be opened some more to increased the intake airflow (at 813) and allow the possibility for more cold air to enter. Otherwise, they are already fully opened ("yes" branch at 812) and it is the exhaust dampers 278 that need to be opened to allow increased air exhaust (at 815) and, thus, increased air exchange with the outside. Otherwise, both intake and exhaust dampers 276 and 278 are fully opened, and it is the mixer dampers 275 that need to be closed some more if it is not already fully closed ("no" branch at 816), to decrease air mixing (at 817) and reduce the warming of the outside air. Otherwise, if the mixing dampers 275 are fully opened ("yes" branch at 816), or if the water is currently being reused by the central facility 100 ("yes" branch at 811), then the coils 222 need to absorb more heat by increasing their water flow (at 818).

Back to FIG. 8*a*, the next step is adjusting the humidifier output (at 809) if the relative humidity in the cold air plenum 216 is out of limits ("yes" branch at 808) for normal operations of the computer servers, as specified by the computer manufacturers. The method for making this adjustment again uses standard algorithms. After this step, the process starts over by checking repeatedly outside air conditions, differential pressure, cold air plenum temperature, and humidity, and by making adjustments, whenever necessary.

The humidifiers increase relative humidity, essentially when the outside air temperature is very cold, and thus too dry once it has been warmed to its set-point temperature. For this purpose, the humidifiers 224 vaporize demineralized water using an efficient adiabatic mechanism. During the summer time, the relative humidity inside the module 200 can also become too high if the outside air is too humid. In those cases, however, the system will tend to switch to closed-loop operations, because the air enthalpy probably makes the air-side economizer cycle counterproductive. In any case, the excessive humidity will be removed by the cooling coils 222 through condensation.

Figure 9:
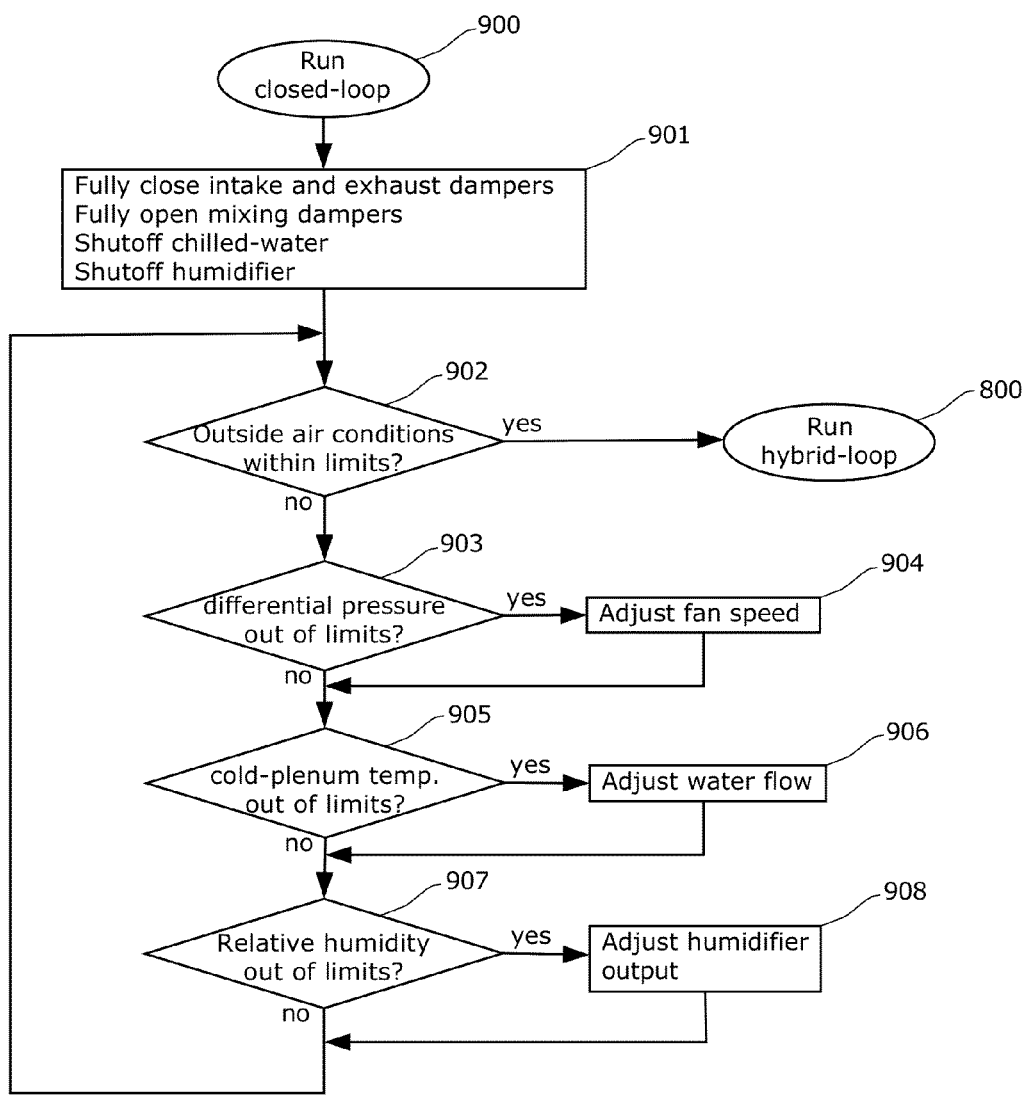
FIG. 9 is a flowchart that illustrates an exemplary closed-loop control method for the cooling system of the prefabricated data center module, in accordance with the principles of the present invention, when the outside air conditions do not permit the efficient use of an air-side economizer cycle.

Referring to FIG. 9, the closed-loop control method 900 for cooling the module 200 is described with the help of a flowchart. The closed-loop method 900 is similar to the hybrid-loop one, but simpler because the temperature regulation has a single variable to work with: the flow of chilled-water in the coils 222. The method 900 starts by fully closing the intake and exhaust dampers 276 and 278, and fully opening the mixing dampers 275 so that all the air in the exhaust plenum 277 is recirculating into the input plenum 218. The chilled-water valve is also initially closed so that no water is flowing through the coils 222, and the humidifiers 224 are shutoff.

Then, the method enters a loop where outside air conditions are first evaluated. If temperature and humidity are within limits ("yes" branch at 902), then the system can switch back to hybrid-loop operations using the air-side economizer cycle. It should be noted here that the outside condition limits for switching from closed-loop to hybrid-loop are not necessarily the same as the one for switching from hybrid-loop to closed-loop. Some hysteresis should be used so that the system does not oscillate between the two modes of operation. If outside conditions are unfavorable ("no" branch at 902), then the method continues by measuring the differential pressure on all floors, between the cold and hot aisles 239 and 241, on both sides of the cabinet rows 240. The lowest measurement is kept and used to adjust the fan speed (at 904) if the differential pressure is determined to be out of limits ("yes" branch at 903). The acceptable range of differential pressure is between two small positive values. In the case where the cold-aisle 239 is maintained at temperatures below 20 degrees Celsius, the lower end of this range should be approximately zero; if the cold-aisles 239 are operated at higher temperature, it may need to be somewhat above zero to maintain a more aggressive minimum differential pressure. The speed adjustment method uses standard control algorithms for this purpose.

The next step is to regulate the temperature of the cold-aisle 239 by controlling the flow of water in the coils 222. The temperature is measured at the output of the cooling sub-system in the cold air central plenum 216. When the current temperature is out of limits ("yes" branch at 905), the method simply adjusts the water flow (at 906) in the coils 222 using standard control algorithms for this purpose.

The final step is adjusting the humidifier output (at 908) if the relative humidity in the cold air plenum 216 is out of limit ("yes" branch at 907) for normal operations of servers, as specified by the computer manufacturers. The method for making this adjustment again uses standard control algorithms. After this step, the process starts over by checking repeatedly outside air conditions, differential pressure, temperature, and humidity, and by making adjustments, whenever necessary.

While illustrative and presently preferred embodiments of the invention have been described in detail hereinabove, it is to be understood that the inventive concepts may be otherwise variously embodied and employed and that the appended claims are intended to be construed to include such variations except insofar as limited by the prior art.

The invention claimed is:

1. A data center module, the module comprising an outer envelop and a plurality of levels, the plurality of levels being superimposed one over the other and comprising a bottom level and at least two upper levels, the bottom level comprising a mechanical system and an electrical system, the at least two upper levels, comprising a plurality of computing machines, the plurality of levels being in fluid communication thereby allowing downward and upward movements of air within the module, the module comprising an air handling unit, the air handling unit being in fluid communication with the at least two upper levels, wherein each of the plurality of levels is partitioned into a first area and a second area;
the first areas of the plurality of levels are in fluid communication to allow downward movements of air within the module, and wherein the second areas of the plurality of levels are in fluid communication to allow upward movements of air within the module;
the first area and the second area of the bottom level are in fluid communication to allow air moving downwardly into the first area to transfer into the second area;
the computing machines are located in the second area of each of the at least two upper levels;
the computing machines are arranged in at least one row, and wherein the at least one row defines at least two aisles;
the at least two aisles comprise at least one cold aisle located on one side of the at least one row of computing machines, the at least one cold aisle carrying cooling air toward the computing machines;
the at least two aisles comprise at least one hot aisle located on the other side of the at least one row of computing machines, the hot aisle upwardly carrying warmed cooling air flowing out of the computing machines;
the at least one hot aisles have an increasing cross-section when going up from one upper level to the next upper level.

2. A data center module as claimed in claim 1, further comprising a cooling system which comprises at least one cooling coil located between the first area and the second area and through which air can flow.

3. A data center module as claimed in claim 1, wherein the at least one hot aisle of a top of the at least two upper levels is in fluid communication with the air handling unit to allow air moving upwardly from the second area of the top most upper level to transfer downwardly into its first area.

4. A data center module as claimed in claim 1, wherein the air handling unit comprises at least one air intake having dampers for controlling an amount of air mostly from outside entering the module.

5. A data center module as claimed in claim 1, wherein the air handling unit comprises at least one air exhaust having dampers for controlling an amount of air mostly from inside exiting the module.

6. A data center module as claimed in claim 1, wherein the air handling unit comprises recirculation dampers for controlling an amount of air moving upwardly within the module to be recirculated with air moving downwardly within the module.

7. A data center complex comprises a central facility and at least one data center module in communication with the central facility, wherein the at least one data center module comprises an outer envelop and a plurality of levels, the plurality of levels being superimposed one over the other and comprising a bottom level and at least two upper levels, the bottom level comprising a mechanical system and an electrical system, the at least two upper levels comprising a plurality of computing machines, the plurality of levels being in fluid communication thereby allowing downward and upward movements of air within the module, the module comprising an air handling unit, the air handling unit being in fluid communication with the at least two upper levels, wherein each of the plurality of levels is partitioned into a first area and a second area;
the first areas of the plurality of levels are in fluid communication to allow downward movements of air within the module, and wherein the second areas of the plurality of levels are in fluid communication to allow upward movements of air within the module;
the first area and the second area of the bottom level are in fluid communication to allow air moving downwardly into the first area to transfer into the second area;

the computing machines are located in the second area of each of the at least two upper levels;

the computing machines are arranged in at least one row, and wherein the at least one row defines at least two aisles;

the at least two aisles comprise at least one cold aisle located on one side of the at least one row of computing machines, the at least one cold aisle carrying cooling air toward the computing machines;

the at least two aisles comprise at least one hot aisle located on the other side of the at least one row of computing machines, the hot aisle upwardly carrying warmed cooling air flowing out of the computing machines;

the at least one hot aisles have an increasing cross-section when going up from one upper level to the next upper level.

8. A method to deploy a data center complex comprising a central facility and at least one data center module, wherein the at least one data center module comprises an outer envelop and a plurality of levels, the plurality of levels being superimposed one over the other and comprising a bottom level and at least two upper levels, the bottom level comprising a mechanical system and an electrical system, the at least two upper levels comprising a plurality of computing machines, the plurality of levels being in fluid communication thereby allowing downward and upward movements of air within the module, the module comprising an air handling unit, the air handling unit being in fluid communication with the at least two upper levels, wherein each of the plurality of levels is partitioned into a first area and a second area;

the first areas of the plurality of levels are in fluid communication to allow downward movements of air within the module, and wherein the second areas of the plurality of levels are in fluid communication to allow upward movements of air within the module;

the first area and the second area of the bottom level are in fluid communication to allow air moving downwardly into the first area to transfer into the second area;

the computing machines are located in the second area of each of the at least two upper levels;

the computing machines are arranged in at least one row and wherein the at least one row defines at least two aisles;

the at least two aisles comprise at least one cold aisle located on one side of the at least one row of computing machines, the at least one cold aisle carrying cooling air toward the computing machines;

the at least two aisles comprise at least one hot aisle located on the other side of the at least one row of computing machines, the hot aisle upwardly carrying warmed cooling air flowing out of the computing machines;

the at least one hot aisles have an increasing, cross-section when going up from one upper level to the next upper level, the method comprising the steps for:

building the central facility;

building a foundation for the least one data center module;

building the at least one data center module on the foundation.

9. A method to deploy a data center complex as claimed in claim 8, wherein:

the at least one hot aisle of a top of the at least two upper levels is in fluid communication with the air handling unit to allow air moving upwardly from the second area of the top most upper level to transfer downwardly into its first area.

* * * * *